United States Patent [19]

Pecukonis

[11] Patent Number: 4,804,907

[45] Date of Patent: Feb. 14, 1989

[54] CONDUCTOR TRACER WITH IMPROVED CURRENT REGULATING TRANSMITTER

[75] Inventor: Joseph P. Pecukonis, Littleton, Colo.

[73] Assignee: Pasar, Inc., Denver, Colo.

[21] Appl. No.: 12,244

[22] Filed: Feb. 9, 1987

[51] Int. Cl.⁴ .......................... G01R 31/02; G05F 3/16
[52] U.S. Cl. ........................................ 324/67; 323/315
[58] Field of Search ................. 324/66, 67; 323/273, 323/277, 278, 299, 303, 312, 315

[56] References Cited

U.S. PATENT DOCUMENTS

| | | | |
|---|---|---|---|
| 3,114,872 | 12/1963 | Allard | 323/315 |
| 3,255,402 | 7/1966 | Vollnhals | 323/315 |
| 3,769,572 | 10/1973 | Doubt | 323/315 |
| 3,810,003 | 5/1974 | Portoulas | 324/66 |
| 3,829,765 | 8/1974 | Siler | 324/67 |
| 4,021,730 | 5/1977 | Brinegar | 324/67 X |
| 4,114,092 | 9/1978 | Fry, Jr. | 324/66 |
| 4,121,152 | 10/1978 | Hale et al. | 324/66 |
| 4,399,399 | 8/1983 | Joseph | 323/315 |
| 4,491,785 | 1/1985 | Pecukonis | 324/67 |
| 4,642,556 | 2/1987 | Pecukonis | 324/67 |

Primary Examiner—Gerard R. Strecker
Attorney, Agent, or Firm—John R. Ley

[57] ABSTRACT

A conductor tracer which is used to trace and identify an energized conductor includes a transmitter which draws a current tracing signal from the energized conductor. The magnitude of the current drawn is regulated substantially independently of the voltage on the conductor. A current regulating circuit is periodically switched to conduct current from the energized conductor. The constant current circuit responds both to the current drawn and the voltage on the conductor. At relatively high voltages the current is conducted primarily through passive resistive elements which can absorb the relatively high power and dissipate it as heat. At relatively low voltages, a current regulating transistor regulates the amount of current drawn. At relatively low voltages on the conductor the regulating transistor does not experience damaging heat.

10 Claims, 3 Drawing Sheets

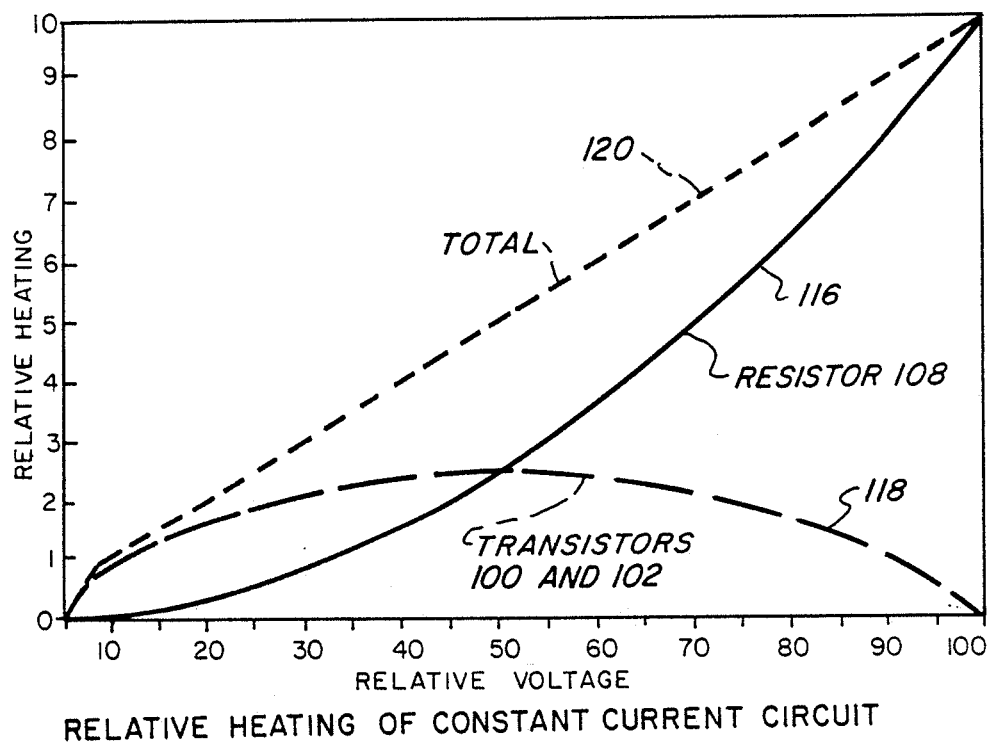
RELATIVE HEATING OF CONSTANT CURRENT CIRCUIT
Fig_2
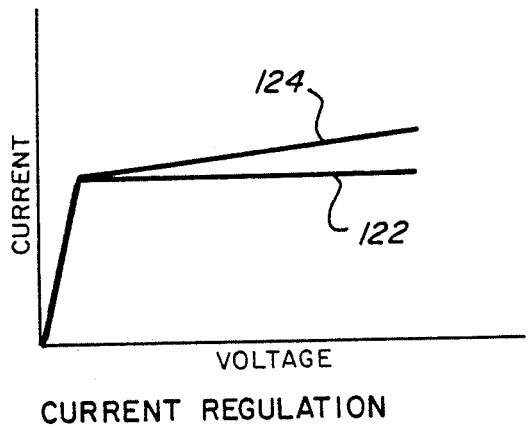
CURRENT REGULATION
Fig_3

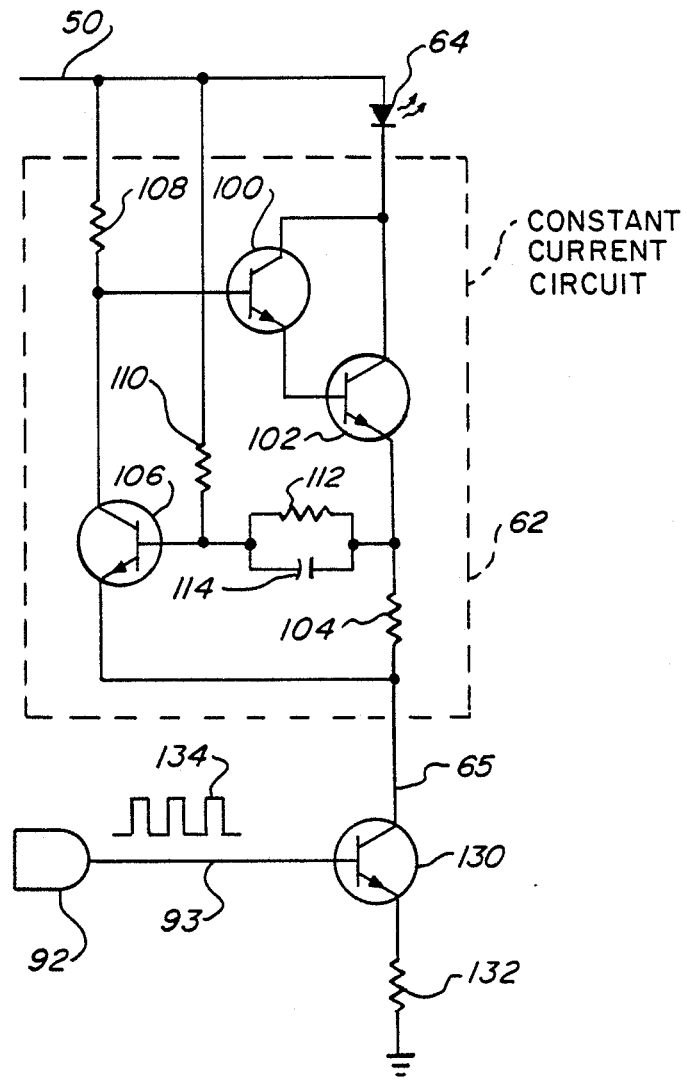
Fig_4

CONDUCTOR TRACER WITH IMPROVED CURRENT REGULATING TRANSMITTER

CROSS-REFERENCE TO RELATED APPLICATION

This invention is a continuation in part of the invention described in U.S. patent application Ser. No. 631,544, filed July 10, 1984, now U.S. Pat. No. 4,642,556. Application Ser. No. 631,544 was a continuation in part of application Ser. No. 236,050, filed Feb. 19, 1981, now U.S. Pat. No. 4,491,785. This present application is also related to an invention for a Conductor Tracer Transmitter with Non-Reversing Magnetic Field Tracing Signal, Ser. No. 012,742, filed concurrently herewith, now U.S. Pat. No. 4,775,832. The disclosures of the above are incorporated herein by this reference. All the applications and patents described above are assigned to the assignee hereof.

BACKGROUND OF THE INVENTION

The present invention relates to an apparatus for tracing and identifying energized, electrical current-carrying conductors, More particularly, the present invention relates to improvements in a transmitter of this type of conductor tracer apparatus, wherein the current drawn from the conductor is more constantly regulated, and the means by which current regulation is achieved contributes to greater longevity and less heat generation in the active current regulating circuit components of the transmitter.

In a conductor tracer of the type disclosed in U.S. Pat. No. 4,491,785, a transmitter draws or absorbs a current tracing signal as a series of high frequency pulses from a conductor energized by AC energizing power from an AC power source. The current tracing signal creates a predetermined electromagnetic or magnetic field tracing signal around the conductor. The magnetic field tracing signal has a strength characteristic which is directly related to the magnitude of the current tracing signal, and has a polarity characteristic which is directly related to the direction of current flow in the conductor. A receiver of the conductor tracer detects the magnitude of the magnetic field tracing signal, and the relative magnitude is employed to distinguish the conductor carrying the current tracing signal from adjacent conductors which are not carrying the current tracing signal.

It is desirable to regulate the current drawn by the transmitter to a constant value. By maintaining the current tracing signal at a relatively constant magnitude, a relatively constant magnitude magnetic field tracing signal is created about the conductor. The resulting relatively constant magnetic field tracing signal, when detected by the receiver, makes it easier to distinguish the conductor carrying the tracing signal from adjacent conductors. Regulating the current on a conductor carrying AC energizing power requires additional considerations because the relative voltage and polarity between the conductor and ground is constantly changing and the direction of current flow reverses with each successive half cycle of the AC power.

Approaches to regulating the amount of current drawn by the transmitter to create a generally uniform strength magnetic field tracing signal are disclosed in U.S. Pat. Nos. 4,491,785 and 4,642,556. The application for a Conductor Tracer with Non-Reversing Electromagnetic Field Tracing Signal, discloses a transmitter which creates a particular type of current tracing signal that avoids the detection problems associated with reversals in the polarity of the magnetic field tracing signal with successive half cycles of the AC energizing signal.

One approach in attempting to draw a relatively constant current from a conductor energized by AC power is to utilize a variable load resistance element whose resistance varies in direct relation to the voltage on the conductor. The typical variable resistance load is an emitter-follower transistor where the emitter to collector resistance varies in relation to the voltage, to thereby attempt to limit the current drawn to a relatively constant value. When the collector to emitter resistance is high and the transistor is conducting, the transmitter must absorb considerable electrical power to keep the drawn current constant. The transistor heats up in direct relation to the power it absorbs. Excessive heat in a transistor is detrimental and will severely reduce the lifetime of the transistor. Transistors which are capable of withstanding higher heating levels are relatively expensive. Additional heat sinks and other heat dissipating equipment needed to remove the excess heat from the transistor increase the cost and size of the transmitter.

On approach to avoiding excessive transistor heating is to use a resistor as the primary load and energy absorbing element. A transistor connects the load resistor across the conductor and ground, and the load current flows through the resistor. Resistors, of course, are relatively inexpensive and are intended to absorb relatively large amounts of power without detrimental consequences. The transistor usually does not experience elevated heating because its collector to emitter resistance is low and therefore it absorbs only a very small portion of the energy absorbed from the conductor. U.S. Pat. No. 4,491,785 discloses one such arrangement.

The problems associated with the fixed resistor load technique are that the current regulation capability is reduced and the operating voltage range of the transmitter is limited. The fixed resistive load element conducts current in an amount which is primarily related to the voltage on the conductor. Since the voltage on the conductor is constantly changing, the current flow absorbed by the conductor tracer transmitter also changes, creating a correspondingly changing magnetic field tracing signal which, when detected by the receiver, makes distinguishing the relative magnitude of the tracing signal more difficult. Since the value of the fixed load resistor is also selected to inhibit destructive current flow in the transistor at high voltages, the current flow reduces to an amount which is insufficient to create an adequate magnetic field tracing signal during low voltage conditions. The effective operating voltage range of the transmitter is limited according to voltage on the conductor.

In addition to requiring relatively expensive heat resistant transistors and heat dissipating equipment, the current regulation technique of using a non-saturated emitter-follower transistor as a component of the load also does not regulate the current as constantly as is desired. It has been discovered that such a single transistor emitter-follower regulator tends to increase somewhat the regulated amount of current conducted in direct relation to the voltage on the conductor.

BRIEF SUMMARY OF THE INVENTION

The present invention eliminates or minimizes the problems associated with non-uniform current regulation and transistor heating in conductor tracers employing current regulation.

In accordance with its major aspects, the present invention is for an improved transmitter of a conductor tracer which better regulates the quantity of current drawn by the transmitter and does so substantially independently of the magnitude of the voltage on the conductor. The transmitter includes a current regulating means by which to regulate the current drawn from the conductor by the transmitter. Means electrically connects the current regulating means to the conductor and thereby periodically establishes the current flow through the current regulating means to create the current tracing signal conducted by the conductor. The current regulating means includes a passive resistive means and a regulating transistor means, both of which conduct portions of the current making up the regulated current drawn by the current regulation means. Means such as a control transistor is electrically connected to the passive resistive means and the regulating transistor means and is operative to shift the current flow primarily through the resistive elements when relatively high voltages are present on the conductor and to shift the primary current flow through the regulating transistor means at relatively low voltages on the conductor. The passive resistive means is capable of withstanding the relatively high power consumed at the high voltages, and the regulating transistor means is not required to withstand high energy absorption so is not susceptible to dangerous heating. At relatively low voltages on the conductor, the regulating transistor means can readily withstand the lower power absorption requirement and still provide the regulated current flow. The transmitter remains operative over a wider voltage range.

The actual scope of the invention is defined by the appended claims but has been generally summarized above. A preferred embodiment of the present invention, and a better understanding of the invention itself, is presented in the following detailed description of a preferred embodiment, and in the accompanying drawings which are next briefly described.

BRIEF DESCRIPTION OF THE DRAWINGS

FIG. 2 is a graph of relative heating or energy absorbed versus relative voltage present on the conductor, illustrated in relation to the transmitter shown in FIG. 1, and two of the components of the transmitter shown in FIG. 1.

FIG. 3 is a graph illustrating current regulation versus the voltage on the conductor, of the transmitter shown in FIG. 1 in relation to the elimination of certain circuit components of the transmitter shown in FIG. 1.

FIG. 4 is a schematic circuit diagram illustrating a portion of the circuit shown in FIG. 1 and further circuitry used in another embodiment of the present invention.

DETAILED DESCRIPTION

Figure 1:
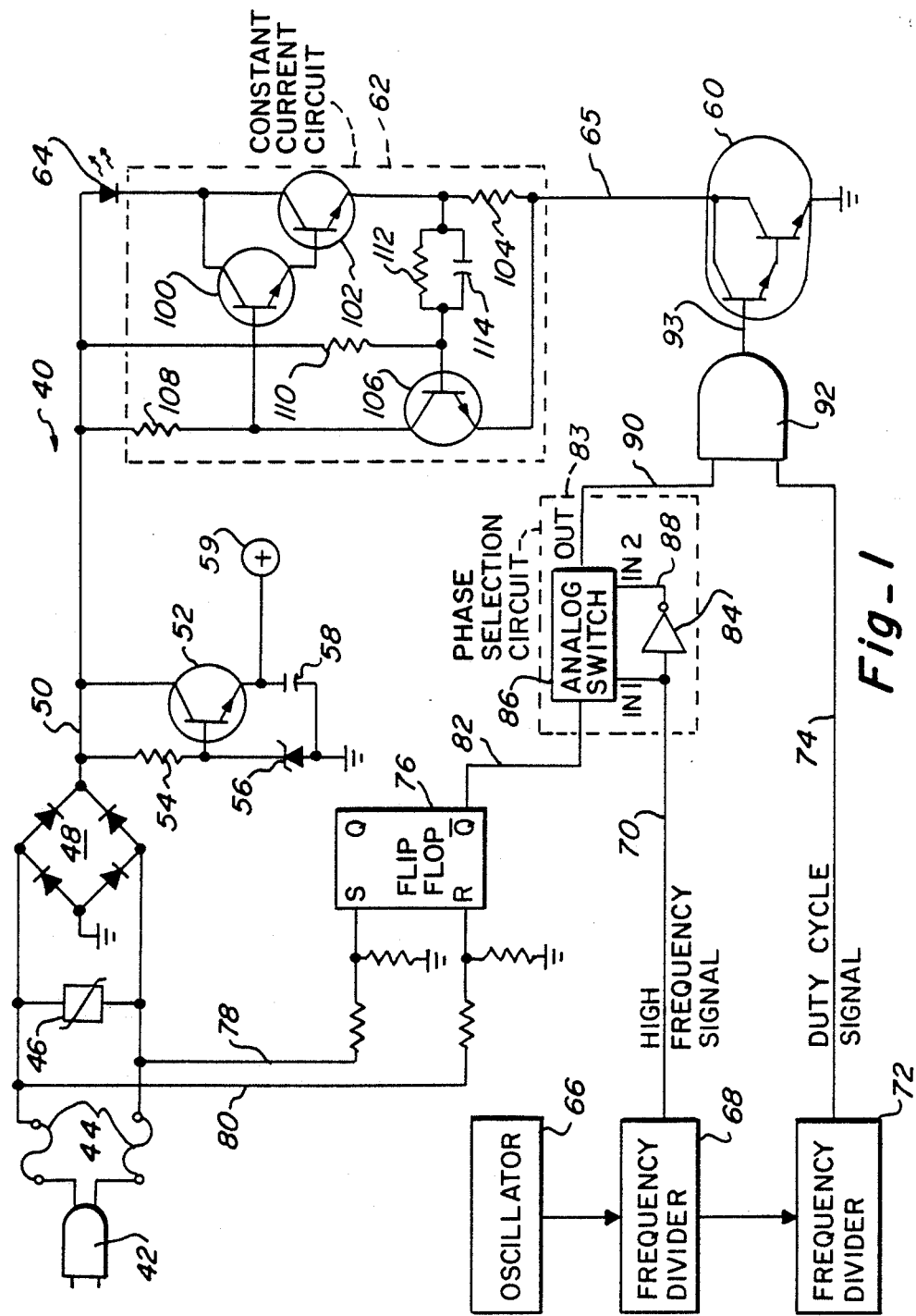
FIG. 1 is a schematic and block diagram of the improved transmitter of a conductor tracer of the present invention.

The improved conductor tracer transmitter 40 of the present invention is illustrated in FIG. 1. The transmitter 40 is connected by a power plug 42 to the electrical conductor (not shown) which is to be traced and identified. A pair of fuses 44 protect the transmitter 40 against high current conditions, and a varistor 46 protects the transmitter against over-voltage conditions. A full wave rectifier 48 rectifies the AC energizing signal present at the power plug 42 to a full wave rectified form and presents the full wave rectified signal on conductor 50.

A transistor 52, and its associated resistor 54, Zener diode 56 and capacitor 58 are connected to the conductor 50 in a conventional manner and operatively derive a supply of regulated low voltage DC power at 59 for the digital and other circuit elements of the transmitter 40 which require such a low voltage power supply.

A power switching transistor 60 operatively conducts current from the conductor 50 through a constant current circuit 62 and a light emitting diode (LED) 64. As will be described subsequently, the transistor 60 is triggered on and off by triggering pulses occurring at the predetermined high frequency of the current tracing signal. When the transistor 60 is turned on, the constant current circuit 62 conducts a regulated constant current from the conductor 50 through a conductor 65 and the transistor 60 to ground. When the LED 64 emits light, the user knows that the transmitter 40 is operating. The constant current conducted through the circuit 62 to the transistor 60 creates the current tracing signal which is conducted over the conductor (not shown). The constant current circuit 62 achieves improvements in regulating the amount of current drawn from the conductor by the transmitter 40, as are described in greater detail below.

The triggering pulses or signals for the transistor 60 originate from an oscillator 66. The output signal from the oscillator 66 is applied to a first frequency divider 68. The frequency divider 68 divides the oscillator frequency by predetermined factor and supplies a high frequency signal on conductor 70 which occurs at the frequency of the high frequency component of the current tracing signal. The frequency divider 68 also supplies an output signal to a second frequency divider 72. The input signal to the frequency divider 72 is divided by a predetermined factor and supplies a duty cycle signal on conductor 74. The signal on conductor 74 defines the duty cycle of the current tracing signal. During the on time of the duty cycle, the transistor 60 is triggered oh and off. During the off time of the duty cycle signal, the transistor 60 is in a non-conductive or off state.

In order to sense the phase of each half cycle of the applied AC energizing signal, means such as a flip-flop 76 is employed. The set (S) input terminal of the flip-flop 76 is connected by a conductor 78 to one of the conductors connected to the power plug 42. The reset (R) input terminal of the flip-flop 76 is connected by another conductor 80 to the other conductor connected to the power plug 42. When the voltage on conductor 78 is positive relative to conductor 80 during one-half cycle of applied AC power, a positive signal is applied to the set input terminal of the flip-flop 76, and a high output signal is applied at the "Q" output terminal of the flip-flop 76. The high output signal from the Q output terminal is not utilized. On the other hand, when the voltage on conductor 80 is positive relative to conductor 78 during the other half cycle of applied AC power, a positive signal is applied to the reset terminal of flip-flop 76, and a high signal is present at the "not Q" output terminal from the flip-flop 76. Appropriate circuit arrangements are employed to prevent the effects of the simultaneous application of high level signals to both the set and reset input terminals. Triggering the flip-flop 76 in response to the alternating polarity of every successive half cycle of the applied AC energizing signal causes the flip-flop to reliably change states with each half cycle. Thus, a high signal is present at conductor 82 during every other successive half cycle of the applied AC energizing signal.

In order to eliminate the detrimental phase reversal effects of prior art conductor tracer transmitters described previously, means such as a phase selection circuit 83 is used to select one of two 180° phase shifted trigger signals which is to be supplied to the transistor 60 during the on time of the duty cycle. This subject is discussed more completely in the co-pending application for a Conductor Tracer Transmitter With Non-Reversing Magnetic Field Tracing Signal, referenced above.

The phase selection circuit 83 includes an inverter 84 and an analog switch 86. Two input signals are applied to the analog switch 86. One of the input signals is the high frequency signal present on conductor 70, and the other input signal is present on conductor 88. Due to the effects of the inverter 84 the signal on conductor 88 is inverted or phase shifted 180° compared to the signal on conductor 70. The analog switch 86 selects between the two input signals on conductors 70 and 88 in accordance with the presence and absence of a high signal on conductor 82. When the signal on conductor 80 is positive, during positive half cycles of the applied AC energizing signal, a signal at conductor 82 is high and the analog switch 86 applies the signal at conductor 70 as the output signal on conductor 90. Conversely when the signal on conductor 78 is positive during negative half cycles of the applied AC energizing signal, the signal on conductor 88 is applied as the signal at conductor 90.

An AND gate 92 logically combines the signals on conductors 74 and 90 to provide the trigger signal on conductor 93 for the transistor 60. The signal on conductor 90 becomes the triggering signal for the transistor 60 during the on time of the duty cycle established by the duty cycle control signal on conductor 74. During the off time of the duty cycle when the signal on conductor 74 is low, the output signal from the AND gate 90 on conductor 93 is in a low state and the transistor 60 is non-conductive.

The constant current circuit 62 includes a biasing transistor 100 and a current regulation transistor 102. The collectors of the transistors 100 and 102 are connected through the LED 64 to the conductor 50. The emitter of transistor 100 is connected to the base of transistor 102 for the purpose of supplying bias current to the transistor 102. A current regulation sensing means such as a resistor 104 is connected between the emitter of transistor 102 and the transistor 60. The voltage developed across resistor 104 helps establish the amount of bias applied to the base of a control transistor 106. The collector of the transistor 106 is connected through a resistor 108 to the conductor 50. A voltage sensing means such as resistor 110 is connected between the conductor 50 and the base of control transistor 106, and a resistor 112 is connected between the emitter of transistor 102 and the base of transistor 106. A capacitor 114 is connected in parallel with the resistor 112. The purpose of the capacitor 114 and the resistor 112 is to act as a high frequency filter to prevent oscillation of the transistors in the constant current circuit 62 in response to spurious voltage spikes and the like which might be present on the conductor to which the transmitter 40 is connected. Resistors 110 and 112 form a divider network for biasing the transistor 106 in relation to the voltage on conductor 50 and the voltage developed across resistor 104.

One function of resistor 108 is to supply base drive current to the biasing transistor 100, and the transistor 100 in turn supplies base drive current to the regulating transistor 102. Once a predetermined amount of current flows through the resistor 104, the base drive current for transistor 106 increases, and the transistor 106 conducts more current through resistor 108, thus lowering the voltage present on the base of the biasing transistor 100, tending to turn it and the regulating transistor 102 off. Transistor 106 diverts current through resistor 108 and away from transistor 100. This controls the current flow through transistors 100 and 102 to establish a stabilized, regulated situation. The conductiveness of transistor 106 becomes inversely related to the quantity of current flowing through the resistor 104, and the quantity of current flowing through the resistor 108 becomes directly related to the conductiveness of transistor 106.

The constant current circuit 62 draws a constant current from the conductor to which the transmitter is attached, and this constant current is more precisely regulated than would have been possible by a conventional constant current circuit in a conductor tracer transmitter. The constant current circuit 62 also causes a large amount of power to be absorbed by passive resistive means, resistor 108, when the voltage is high, thereby avoiding excessive heating in the regulating transistor 102. However, when the voltage is low, the primary amount of power absorbed by the constant current circuit 62 is absorbed by the transistor 102, which does not experience significant heating. Thus, the constant current circuit 62 has the effect of more precisely regulating the current drawn to a constant value, and causes the heat or power absorbed by the transmitter at high voltages to be absorbed by resistors which are capable of withstanding the high power requirements, but shifts the major load component of the transmitter to the regulating transistor 102 under low voltage conditions where excessive heat will not be generated.

The control transistor 106 operatively shifts the major portion of the current flow through the resistor 108 at relatively high voltages and through the transistor 102 at relatively low voltages. The resistor 108 is selected to have a value which equals the maximum amount of current to be absorbed under the highest voltage normal operating condition. Under high voltage conditions, the effects of the voltage divider of resistances 110, 112 and 104 provide a high voltage driving source to the base of control transistor 106. Under high voltage conditions transistor 106 turns on and becomes saturated so that substantially all of the current drawn from conductor 50 passes through the resistor 108 and transistor 106. Because in its saturated condition, transistor 106 does not experience a significant voltage drop between its collector and emitter, it does not experience significant heating under high voltage conditions. Since resistor 108 can more nearly accommodate higher power absorption requirements without detrimental effect, the more sensitive transistor 106 is spared from the potentially detrimental influences of high heating. Under low voltage conditions, the control transistor 106 is not saturated and exhibits a resistance dependent in part on the current flow through resistor 104. Because the voltage is low, the transistors 100, 102 and 106 do not experience significant or detrimental heating in regulating the current flow.

Since resistor 108 can more nearly accommodate higher power absorption requirements without detrimental effect, the more sensitive transistor 106 is spared from the potentially detrimental influences of high heating.

The effect is better illustrated in the graphs shown in FIG. 2. The curve 116 illustrates the relative heating or power consumed by resistor 108 in relation to the relative voltage present on the conductor to which the current tracing signal is supplied. Curve 116 increases exponentially because the power absorbed by the resistor 108 is related to the square of the relative voltage. The curve 118 illustrates the relative heating or power absorbed by the transistors 100 and 102. At relatively low voltages, substantially all of the power flowing through the constant current circuit 62 (FIG. 1) is absorbed by transistors 100 and 102. However, as the voltage increases the amount of current flowing through resistor 108 (FIG. 1) starts to increase and the current flow and hence energy absorbed by the transistors 100 and 102 begins to drop off in a downward curve. The effect of the power consumption by the resistor 108 and the transistors 100 and 102 is the line 120, which is the sum of the curves 116 and 118. At any point along the relative voltage axis, the contribution to the total heating, line 120, is established by adding the two curves 116 and 118. The line 120 is linear over approximately 90% of the relative voltage range. A 90% linearity of a current regulating circuit is a substantial improvement and advantage, particularly in view of the fact that the voltage on the conductor drops to an insufficient level to conduct the desired constant current shortly before and after the zero crossing points of the AC power energizing signal.

The improvements are also illustrated in FIG. 3. Graph 122 shown in FIG. 3 illustrates the regulation of current attainable by the constant current circuit 62 (FIG. 1). Curve 122 stays relatively constant with increases in the voltage past an initial relatively low voltage level. Curve 124 illustrates the current regulation effect which would be available from a circuit similar to the constant current circuit 62 shown in FIG. 1 if resistors 110 and 112 and the capacitor 114 were not present, or if a single transistor current regulator was employed. Notice that despite the best regulation effects available from such prior circuit arrangements, the current still increases moderately with respect to increases in voltage, thus indicating that the prior circuit arrangements do have somewhat of a net resistive effect.

The constant current circuit 62 thus achieves the advantages of causing the current to be more precisely regulated, and causing the current absorbed at high voltages to be absorbed by resistive elements which are relatively immune to high heating levels, while causing the current absorbed at relatively low voltages to be precisely regulated by a variable resistance transistor means which will not experience significant heating under low voltages.

Circuit component values and the components themselves which have proved satisfactory in a version of the transmitter 40 shown in FIG. 1 are as follows: Resistor 104, 4.2 ohms; resistor 108, 1,200 ohms, 5 watts; resistor 110, 100,000 ohms; resistor 112, 220 ohms; capacitor 114, 0.001 microfarad; transistor 100, 2n3439; transistor 102, TIP 50; and transistor 106, 2n4401.

A further embodiment of the present invention is illustrated in FIG. 4. The circuitry illustrated in FIG. 4 is to be substituted for part of the circuitry in the transmitter shown in FIG. 1. Specifically, the transistor 60 of FIG. 1 is replaced by a transistor 130 and a resistor 132. The transistor 130 and the resistor 132 are connected in an emitter follower configuration.

The transistor 130 functions as a switch for conducting current through the constant current circuit 62 in the same manner as has been previously described. However, because the transistor 130 and the resistor 132 are connected in the emitter follower arrangement, the elements 130 and 132 also become a current regulating circuit. The signal applied on conductor 93 from the AND gate 92 is a series of uniform amplitude rectangular pulses illustrated at 134. Each of the pulses at 134 causes the transistor 130 to conduct, and the voltage developed across resistor 132 becomes approximately equal to the amplitude of each of the pulses at 134. Since each of the pulses at 134 is a constant amplitude, a constant current is conducted by the transistor 130 to develop the relatively constant voltage across the resistor 132. Thus, in addition to functioning as a switch, the transistor 130 and resistor 132 become a current regulating circuit.

The circuit arrangement shown in FIG. 4 provides two current regulating circuits, one at 62 and another established by the elements 130 and 132. By utilizing two current regulating circuits, the amount of heat generated to regulate a constant current by each of the two individual current regulating circuits is reduced. The heat is distributed between two current regulating circuits to increase the useful longevity and effectiveness of the elements of both current regulating circuits. Although transistors have been described and illustrated in conjunction with the current regulating circuits described herein, other types of current control devices such as FETs and other solid state devices might be used under certain circumstances to achieve comparable effects.

The significant improvements available from the present invention have been shown and described with a degree of particularity. It should be understood, however, that the detailed description has been offered by way of a preferred example, and that the scope of the present invention is defined by the appended claims.

What is claimed is:

1. In a conductor tracer used to trace and identify an energized conductor, an improved transmitter for connection to the conductor by which to draw pulses of substantially constant current from the conductor to create a current tracing signal, said transmitter comprising:

current regulating means electrically connected to the conductor and operative for regulating the current flowing through the current regulating means to a substantially constant value and for doing so substantially independently of the voltage on the conductor;

switch means electrically connected to and separate from the current regulating means and operative for causing current to flow from the conductor through the current regulating means when said switch means is triggered into a conductive state;

means for triggering said switch means at a predetermined frequency into the conductive state; and said current regulating means operatively drawing pulses of substantially constant current from the conductor during the times when said switch means is triggered into the conductive state.

2. An invention as defined in claim 1 wherein the current regulating means comprises:
   a passive resistive element;
   a regulating transistor means; and
   means electrically connected to the resistive element and the regulating transistor means and operative for shifting the current flow primarily through the resistive element when relatively high voltages exist on the conductor and primarily through the regulating transistor means when relatively low voltages exist on the conductor.

3. An invention as defined in claim 2 wherein the means for shifting the current flow comprises:
   control transistor means for controlling the current flow through the resistive element in a predetermined inverse relationship to the current conducted by the regulating transistor means.

4. An invention as defined in claim 3 wherein the control transistor means also operatively controls the current flow through the resistive element in a direct predetermined relationship to the voltage on the conductor.

5. An invention as defined in claim 3 wherein the inverse predetermined relationship is established by means comprising:
   current sensing means electrically connected to the regulating transistor means and operative for developing a first signal related to the amount of current conducted by the regulating transistor means;
   voltage sensing means electrically connected to the conductor and operative for developing a second signal related to the voltage present on the conductor to which the transmitter is connected; and
   means receptive of the first and second signals for controlling the conduction of the control transistor means.

6. An invention as defined in claim 5 wherein
   the current sensing means comprises a first passive current sensing resistor;
   all current conducted by the regulating transistor means is conducted through the current sensing resistor;
   the voltage sensing means comprises a voltage sensing resistor electrically connected to the conductor to develop a voltage thereacross related to the voltage on the conductor, the current and voltage sensing resistors are electrically connected at a junction; and
   the control transistor means is operatively controlled in response to the signal at the junction.

7. An invention as defined in claim 1 wherein said switch means further comprises second current regulation means in addition to and separate from the current regulation means first aforesaid, said second current regulation means substantially regulating the amount of current conducted therethrough to divide the heating effect created by the current regulation between the first and second current regulating means.

8. In a conductor tracer used to trace and identify a conductor energized by an AC energizing signal, comprising a transmitter for connection to the conductor including switch means for drawing pulses of current from the conductor to create a current tracing signal in the conductor, and an improved current regulating means for regulating the quantity of current of each pulse of the current tracing signal to a substantially constant value and for doing so substantially independent of the normal fluctuations in the magnitude of the AC voltage on the conductor, said current regulating means comprising:
   passive resistive means electrically connected to the conductor to which the transmitter is connected for conducting a current through the passive resistive means when said switch means conducts each pulse of current;
   regulating transistor means electrically connected to the conductor to which the transmitter is connected and to the passive resistive means and operative for conducting current from the conductor in a predetermined inverse relationship to the current flowing through the passive resistive means when said switch means conducts each pulse of current;
   current sensing means electrically connected to receive the current conducted by the regulating transistor means and operative for developing a first signal related to the current conducted through the regulating transistor means;
   voltage sensing means electrically connected to the conductor to which the transmitter is connected and operative for developing a second signal related to the voltage on the conductor; and
   control transistor means electrically connected to the current and voltage sensing means and responsive to the first and second signals and operative for conducting a major portion of the current flowing through the current regulating means through the passive resistive means when relatively high voltages exist on the conductor, and operative for diverting a major portion of the current flowing through the current regulating means through the regulating transistor means when relatively low voltages exist on the conductor, and operative for distributing the relative current flow between the passive resistive means and the transistor regulating means when intermediate voltages exist on the conductor.

9. An invention as defined in claim 8 wherein said switch means further comprises additional means for regulating the amount of current switched from the conductor through the current regulating means.

10. In a conductor tracer used to trace and identify a conductor energized by an AC energizing signal, comprising a transmitter for connection to the conductor including switch means for drawing pulses of current from the conductor to create a current tracing signal in the conductor, and an improved current regulating means for regulating the quantity of current of each pulse of the current tracing signal to a substantially constant value and for doing so substantially independent of the normal fluctuations in the magnitude of the AC voltage on the conductor, said current regulating means comprising:
   a passive resistive element electrically connected to the conductor for conducting a current from the conductor through the passive resistive element when said switch means conducts each pulse of current;
   a regulating transistor means electrically connected to the conductor for conducting a current from the conductor through the regulating transistor means when said switch means conducts each pulse of current; and means electrically connected to the conductor, the resistive element and the regulating transistor means and operative in response to the voltage on the conductor for shifting the current flow primarily through the resistive element when relatively high voltages exist on the conductor and primarily through the regulating transistor means when relatively low voltages exist on the conductor.

* * * * *